(12) United States Patent
Mostert et al.

(10) Patent No.: US 10,698,007 B2
(45) Date of Patent: Jun. 30, 2020

(54) LOAD DETECTOR

(71) Applicant: NXP B.V.

(72) Inventors: Fred Mostert, Horssen (NL); Gertjan van Holland, Ede (NL); Paul Wielage, Waalre (NL)

(73) Assignee: NXP B.V., Eindhoven (NL)

( * ) Notice: Subject to any disclaimer, the term of this patent is extended or adjusted under 35 U.S.C. 154(b) by 494 days.

(21) Appl. No.: 15/612,550

(22) Filed: Jun. 2, 2017

(65) Prior Publication Data

US 2017/0350923 A1 Dec. 7, 2017

(30) Foreign Application Priority Data

Jun. 2, 2016 (EP) .................................... 16172582

(51) Int. Cl.
*G01R 17/02* (2006.01)
*H03F 3/217* (2006.01)
(Continued)

(52) U.S. Cl.
CPC ......... *G01R 17/02* (2013.01); *G01R 31/2825* (2013.01); *H03F 3/181* (2013.01);
(Continued)

(58) Field of Classification Search
CPC . H03F 3/181; H03F 3/217; H03F 3/68; H03F 3/72; H03F 2200/03;
(Continued)

(56) References Cited

U.S. PATENT DOCUMENTS 6,573,729 B1 6/2003 Poulis et al.
6,581,016 B1 7/2003 Yukawa
(Continued)

FOREIGN PATENT DOCUMENTS

WO 2009098609 A1 8/2009

OTHER PUBLICATIONS

Wallace, J. "Diagnosing Automotive Faults with Class D Audio Amplifiers—Application Note 4943", Maxim Integrated, 17 pgs., retreived from the internet at: https://pdfserv.maximintegrated.com/en/an/AN4943.pdf (Mar. 31, 2011).

*Primary Examiner* — Xu Mei
(74) *Attorney, Agent, or Firm* — Rajeev Madnawat

(57) ABSTRACT

A method and apparatus of load detection for an audio amplifier system is described. A load detector includes a first load terminal and a second load terminal; a controller coupled to the first and second load terminals and configured to in a first control loop, vary a first current supplied to a first load terminal dependent on the difference between a first reference signal and the detected first load terminal voltage; and in a second control loop, vary a second current supplied to the second load terminal dependent on the difference between a second reference signal and the detected second load terminal voltage; and to determine a current through a load connected between the first load terminal and the second load terminal from the second current value, and a voltage across the load from the detected voltage difference between the first load terminal voltage and the second load terminal voltage.

15 Claims, 6 Drawing Sheets

(51) Int. Cl.
*H04R 3/00* (2006.01)
*G01R 31/28* (2006.01)
*H03F 3/181* (2006.01)
*H03M 1/12* (2006.01)
*G01R 27/16* (2006.01)
*H03M 1/66* (2006.01)
*G01R 31/00* (2006.01)

(52) U.S. Cl.
CPC ............... *H03F 3/217* (2013.01); *H04R 3/00* (2013.01); *G01R 27/16* (2013.01); *G01R 31/006* (2013.01); *H03F 2200/03* (2013.01); *H03F 2200/165* (2013.01); *H03F 2200/471* (2013.01); *H03M 1/12* (2013.01); *H03M 1/66* (2013.01); *H04R 2420/05* (2013.01)

(58) Field of Classification Search
CPC . H03F 2200/165; H04R 2420/05; H04R 3/00; G10R 17/02; G10R 27/16; G10R 31/2825; G10R 31/006

USPC ................. 381/111, 115, 116, 117, 118, 120
See application file for complete search history.

(56) References Cited

U.S. PATENT DOCUMENTS

| | | | |
|---|---|---|---|
| 8,538,032 B2* | 9/2013 | Woelfl | H04R 3/00 381/59 |
| 8,571,225 B2 | 10/2013 | Botti et al. | |
| 9,438,982 B2* | 9/2016 | Thandri | H04R 1/1041 |
| 10,436,828 B2* | 10/2019 | Gautama | H03F 3/181 |
| 2007/0057720 A1* | 3/2007 | Hand | H03F 1/523 330/10 |
| 2009/0051368 A1* | 2/2009 | Knott | H03F 1/52 324/555 |
| 2009/0121908 A1 | 5/2009 | Regier | |
| 2012/0306518 A1 | 6/2012 | Regier et al. | |
| 2014/0266433 A1* | 9/2014 | Nobbe | H03F 1/30 330/151 |

\* cited by examiner

LOAD DETECTOR

CROSS-REFERENCE TO RELATED APPLICATIONS

This application claims the priority under 35 U.S.C. § 119 of European Patent application no. 16172582.5, filed on Jun. 2, 2016, the contents of which are incorporated by reference herein.

FIELD

This disclosure relates to load detection for audio amplifier systems.

BACKGROUND

Integrated audio power amplifiers may include a system to detect if a load is connected to the output. For automotive audio systems including integrated audio power amplifiers, this load detection may be used during assembly to detect a correctly connected load. A distinction may be made between DC-coupled and AC-coupled loads. In the case of a DC-coupled load, the loudspeaker is connected directly to the output of the amplifier whereas in case of an AC-coupled load a capacitor may be connected in series with the loudspeaker effectively blocking DC-current through the loudspeaker. The AC-coupled configuration is usually used for so-called tweeters. For AC load detection in class-D amplifiers the power stage may be used for detecting AC-coupled loads.

SUMMARY

Various aspects of the disclosure are defined in the accompanying claims. In a first aspect there is defined a load detector for an audio amplifier system, the load detector comprising a first load terminal and a second load terminal; a controller coupled to the first and second load terminals and configured to: in a first control loop, vary a first current supplied to a first load terminal dependent on a first reference signal and a detected first load terminal voltage; in a second control loop, vary a second current supplied to the second load terminal dependent on a second reference signal and a detected second load terminal voltage; wherein at least one of the first reference signal and the second reference signal is a constant value and the controller is configured to determine a load current through a load connected between the first load terminal and the second load terminal from one of the first and second current value, and a load voltage across the load from the difference between the detected first load terminal voltage and the second load terminal voltage.

In one or more embodiments the load detector may further comprising a first and second programmable voltage or current source, each programmable voltage or current source having an input coupled to the controller and an output coupled to a respective one of the first load terminal and the second load terminal, and wherein the controller is further configured to vary the first current by programming the first programmable voltage or current source with a value dependent on the difference between a first reference signal and at least one of the detected first load terminal voltage and the detected voltage difference between the first and second load terminals; and to vary the second current by programming the second programmable current source with a value dependent on the detected second load terminal voltage.

In one or more embodiments each of the first and second programmable voltage or current sources may comprise a digital to analog converter.

In one or more embodiments the load detector may further comprise a voltage detector having a first and second input coupled to a respective one of the first and second load terminals and a first and second output coupled to the controller, wherein the voltage detector is configured to output one of a detected voltage difference value and a first load terminal voltage value on the first output, and further configured to output one of a common mode value and a second load terminal voltage value on the second output.

In one or more embodiments the voltage detector may comprise at least one analog to digital converter.

In one or more embodiments the voltage detector may comprise a first analog to digital converter coupled between the first load terminal and the controller and second analog to digital converter coupled between the second load terminal and the controller.

In one or more embodiments the controller may comprise a differential loop controller arranged in the first control loop, a common mode loop controller arranged in the second control loop, and a signal generator coupled to the differential loop controller and the common mode loop controller, the differential loop controller having an input coupled to the first voltage detector output and an output coupled to the first programmable voltage or current source, the common mode loop controller having an input coupled to the second voltage detector output and an output coupled to the second programmable voltage or current source.

In one or more embodiments each of the differential loop controller and the common mode controller may comprise a series arrangement of a low pass filter, a comparator, and a loop filter, each comparator having a first input coupled to a respective signal generator output, and a second input coupled to a respective low pass filter output.

In one or more embodiments the common mode loop controller may further comprise an attenuator coupled to the second voltage detector output, a further comparator coupled to the attenuator output and configured to determine the difference between the common mode value and the attenuated output, and wherein the further comparator output is coupled to the low pass filter input.

In one or more embodiments the first reference signal may correspond to a required voltage difference between the first and second load terminals and the second reference signal may be a constant value corresponding to a required offset voltage value at the second load terminal.

In one or more embodiments the second reference signal is a constant value and the controller is configured to determine the load current from the second current value.

In one or more embodiments the first reference signal is a constant value and the controller is configured to determine the load current from the first current value.

In one or more embodiments the controller is further configured to determine an average value of load current and load voltage and a standard deviation of the load current and load voltage values.

In one or more embodiments wherein the controller may be further configured to generate a signal indicative of a vehicle door-slam in response to at least one of the first control loop being out of regulation, the second control loop being out of regulation, the load voltage value being above a predetermined threshold, and the standard deviation of the load voltage value being above a predetermined threshold.

In one or more embodiments of the load detector may be included in an amplifier system which may comprise an audio amplifier having at least one power amplifier stage with an output coupled to at least one of the first load terminal and the second load terminal wherein the controller is coupled to the at least one power stage, and wherein the controller is further configured to determine a load impedance of a load connected between the first load terminal and the second load terminal from the detected voltage difference and the second current value and to enable the at least one power stage in response to the load impedance value being within an expected load impedance range.

In a second aspect there is described method for detecting an audio amplifier system load connected between a first load terminal and a second load terminal, the method comprising: generating a first and second reference signal; in a first control loop, varying a first current supplied to a first load terminal dependent on the difference between the first reference signal and a detected first load terminal voltage; in a second control loop, varying a second current supplied to a second load terminal dependent on the difference between the second reference signal and a detected second load terminal voltage; and determining a current through a load connected between the first load terminal and the second load terminal from the second current value, and a voltage across the load from the detected voltage difference.

In the figures and description like reference numerals refer to like features. Embodiments are now described in detail, by way of example only, illustrated by the accompanying drawings in which.

DESCRIPTION

Figure 1:
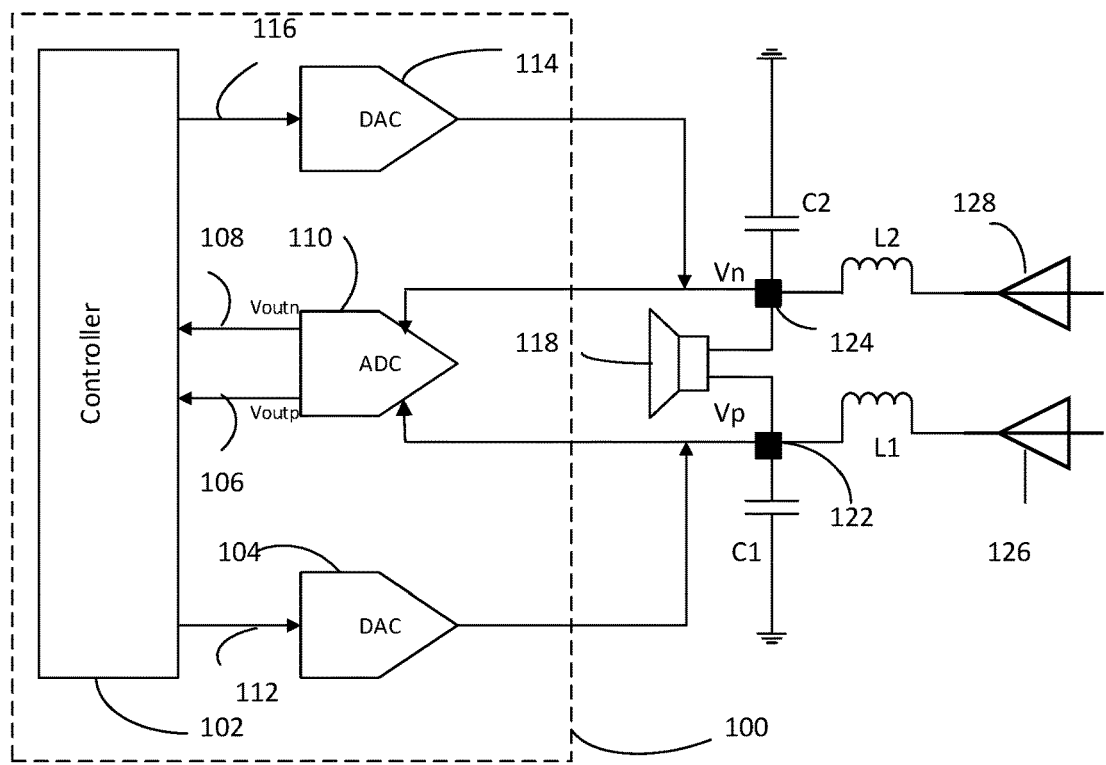
FIG. 1 shows a load detector for an audio amplifier system according to an embodiment.

FIG. 1 shows an audio amplifier system including a load detector 100. The load detector 100 includes a controller 102, a first digital to analog converter (DAC) 104, a second digital to analog converter 114, and an analog to digital converter (ADC) 110 which may be a differential ADC. The controller 102 may have an output 116 connected to the second DAC 114. The controller 102 may have an output 112 connected to the first DAC 104. The controller 102 may be connected to a first output 106 of the ADC 110. The controller 102 may be connected to a second output 108 of the ADC 110. An output of the first DAC 104 may be connected to a first load terminal 122. An output of the second DAC 114 may be connected to a second load terminal 124. A first input of the ADC 110 may be connected to the first load terminal 122. A second input of the ADC 110 may be connected to the second load terminal 124.

In normal operation of an audio amplifier system, a load for example a loudspeaker 118 may be connected between the first load terminal 122 and the second load terminal 124. A first capacitor C1 may be connected between the first load terminal 122 and a ground potential. A second capacitor C2 may be connected between the second load terminal 124 and a ground potential. A first inductor L1 may be connected between the first load terminal 122 and the output of a first power driving stage or power amplifier stage 126. A second inductor L2 may be connected between the second load terminal 124 and the output of a second power driving stage or power amplifier stage 128. The first power driving stage 126 and the second power driving stage 128 may be part of a Class-D audio amplifier. The capacitors C1 and C2 and the inductors L1 and L2 may form an output filter for the class-D amplifier.

During operation of the load detector 100 which may be during a start-up phase of the audio amplifier system, the first power driving stage 126 and the second power driving stage 128 maybe disabled and so first power driving stage 126 and the second power driving stage 128 may be high impedance. The first DAC 104, the ADC 110, and the controller 102 may form a first control loop which may be referred to as a differential control loop. The second DAC 114, the ADC 110, and the controller 102 may form a second control loop which may be referred to as a common mode control loop. The ADC 110 may have a differential value output 106, and a common mode value output 108. The ADC 110 may be considered as a voltage detector, the first DAC 104 and the second DAC 114 may be considered to be programmable current sources.

To measure a characteristic of a connected load, for example the value of a load impedance, the controller 102 may generate a first reference signal which may be constant or varying. In operation of the load detector 100, the ADC 110 may have a first input voltage Vp corresponding to the voltage at first load terminal 122, and a second input voltage Vn corresponding to the voltage at second load terminal 124. The common mode voltage Vcom for the ADC 110 is then (Vp+Vn)/2 and the voltage across a load Vdiff connected to the load terminals 122,124 is Vp−Vn. The common mode output 108 value is denoted Voutn and the differential mode output 106 value is denoted Voutp. The ADC 110 may generate a value Voutn equivalent to Vn and a value Voutp equivalent to Vp.

For the differential control loop, the controller 102 may generate a first reference signal value. The controller 102 may compare the first reference signal value with a difference between differential value output 106 and the common mode value output 108 corresponding to Voutp−Voutn. The first reference signal may correspond to a desired value of Vdiff. As will be appreciated Voutp−Voutn corresponds to the measured value of Vp−Vn or Vdiff between the first and second load terminals 122,124. The resulting comparison value may be input to the first or differential-mode DAC 104 which may then generate a current corresponding to the differential comparison value. In other examples, alternative programmable current sources instead of the differential mode DAC 104 may be used. The differential comparison value may be a difference between the two values being compared. In some examples, the controller 102 may generate a first reference signal corresponding to a desired value of voltage Vp. In this case, the controller 102 may compare the first reference signal value with Voutp.

For the common-mode control loop, the controller 102 may generate a second reference signal which may correspond to a desired value of voltage Vn. The controller 102 may compare the second reference signal with a value of Voutn. As will be appreciated this corresponds to the instantaneous value of common mode voltage Vn of the second load terminal 124. The second reference signal may be a constant or DC value. The resulting common-mode comparison value may be input to the first DAC 104 which may then generate a current corresponding to the common-mode comparison value. The common-mode comparison value may be a difference between the second reference signal and Voutn.

The common mode control loop may regulate Voutn such the voltage Vn at the second load terminal 124 remains constant. The differential control loop may regulate Voutp such that that the voltage value Vp is equal to the sum of Vn and a desired differential voltage which may be a constant or varying.

For a DC load measurement, the differential control loop applies a DC voltage across the load, that is to say the first reference signal value remains constant. The common mode control loop may keep the voltage Vn on the second load terminal 124 at a constant value determined by the second reference signal, which may result in no current flowing into the capacitor C2. Consequently, the current flowing through the speaker 118 may be determined by the second or common mode DAC 114. The controller 102 may determine the voltage difference measured between the first load terminal 122 and the second load terminal 124 which corresponds to the value at the first output 106 of the ADC 110. For DC measurement, the controller 102 may also determine the current flowing through the load from the value of the first or differential mode DAC 112. Hence the controller 102 may determine the impedance from the measured voltage difference across the load terminals 122, 124 and the current flowing through the load 118. The output for the DC-load measurement may be the load value. The controller 102 may determine a mean and standard deviation value for the voltage, current and load values from multiple samples.

For an AC load measurement, the differential mode loop applies an AC voltage across the load, i.e. the first reference signal varies. Similarly to the DC load case, the differential control loop maintains a desired voltage difference across the first and second load terminals 122, 124 determined by the first reference value. The common mode loop keeps the voltage Vn on the second load terminal 124 at a constant value determined by the second reference signal value, which may result in no current flowing into the capacitor C2.

Consequently, the current flow through the speaker 118 is now determined by the second or common mode DAC 114. The controller 102 may determine the voltage difference measured between the first load terminal 122 and the second load terminal 124 which corresponds to the value at the first output 106 of the ADC 110. The controller 102 may determine the current flowing through the load from the value of the common mode DAC 114. Hence the controller 102 may determine the impedance from the measured voltage difference across the load terminals 122, 124, the current flowing through the speaker 118, and using the frequency of the applied AC signal to validate only the frequency band of interest. The impedance calculated may be a magnitude and a phase value. The controller 102 may determine a mean and standard deviation value the impedance value from multiple samples.

Load detector 100 is separated from the power amplifier and the output filtering. For audio loads typically driven by class-D switching amplifiers, the load detector 100 may improve the accuracy of load impedance measurement compared to typical load detectors using the power stages 126, 128, since for example class-D power stages, there is no error due to the ripple current of the class-D switching amplifier. Furthermore there is no need for a current sense circuit in the power path of the amplifier. The power path may have high currents for example several amps, and consequently a sense circuit may either cause power loss or not be accurate enough to measure the load diagnostic current. The load detector 100 may allow the impedance to be determined with low currents typically 100 to 200 mA and at low power and may be used for example to determine if there is a short circuit. Consequently measurement from the load detector 100 may be used by a further control apparatus (not shown) connected to the load detector 100 to determine whether or not it is safe to switch on the power amplifier power stages 126, 128.

The load detector 100 as shown is implemented using a digital control loop or the first and second control loops. In other examples analog control loop circuitry may be used.

Figure 2:
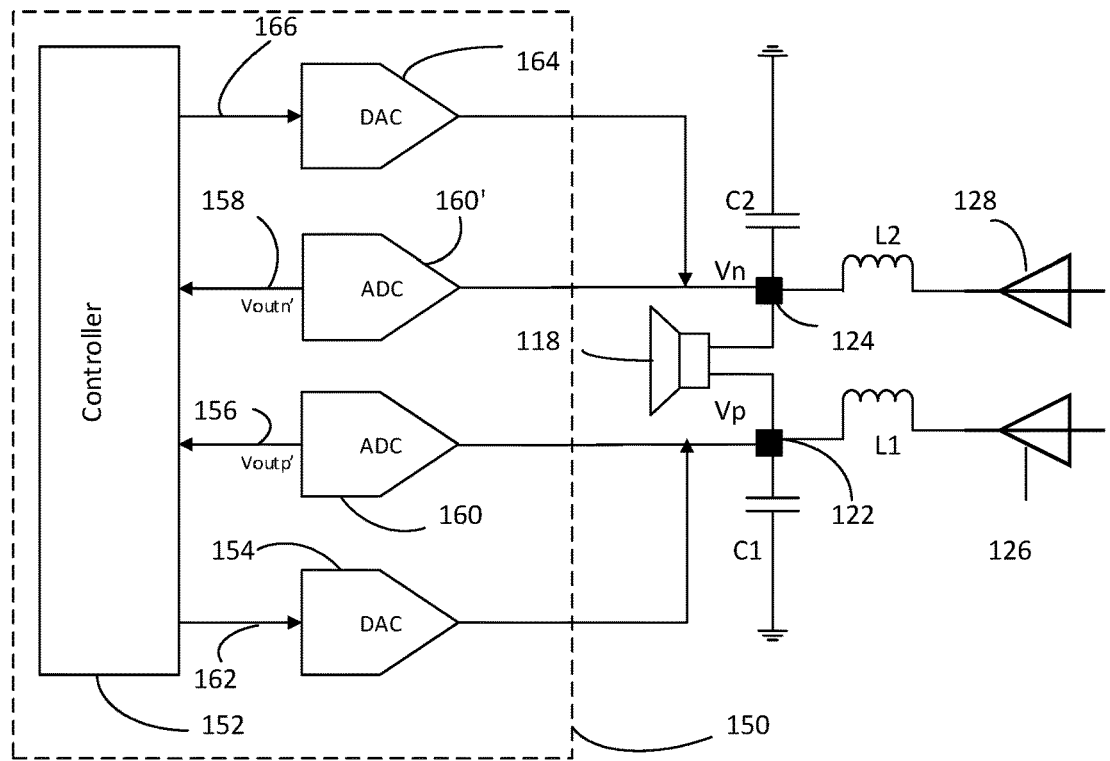
FIG. 2 illustrates a load detector for an audio amplifier system according to an embodiment.

FIG. 2 shows a load detector 150 included in an audio amplifier system. The load detector 150 includes a controller 152, a first digital to analog converter (DAC) 154, a second digital to analog converter 164, a first analog to digital convertor (ADC) 160, and a second analog to digital converter 160'. The controller 152 may have an output 162 connected to the first DAC 154. The controller 152 may have an output 166 connected to the second DAC 164. The controller 152 may be connected to a first output 156 of the first ADC 160. The controller 152 may be connected to a second output 158 of the second ADC 160'.

An output of the first DAC 160 may be connected to a first load terminal 122. An output of the second DAC 164 may be connected to a second load terminal 124. An input of first ADC 160 may be connected to the first load terminal 122. An input of the second ADC 164 may be connected to the second load terminal 124.

In normal operation of the audio amplifier system, a load for example a loudspeaker 118 may be connected between the first load terminal 122 and the second load terminal 124. A first capacitor C1 may be connected between the first load terminal 122 and a ground potential. A second capacitor C2 may be connected between the second load terminal 124 and a ground potential. A first inductor L1 may be connected between the first load terminal 122 and the output of a first power driving stage or power amplifier stage 126. A second inductor L2 may be connected between the second load terminal 124 and the output of a second power driving stage or power amplifier stage 128. The first power driving stage 126 and the second power driving stage 128 may be part of a Class-D audio amplifier. The capacitors C1 and C2 and the inductors L1 and L2 may form an output filter for the class-D amplifier.

During operation of the load detector 150 which may be during a start-up phase of the audio amplifier system, the first power driving stage 126 and the second power driving stage 128 may be disabled and so may be high impedance. In operation of the load detector 150, the first DAC 154, the first ADC 160 and the controller 152 may form a first control loop which may be referred to as a differential control loop. The second DAC 164, the second ADC 160', and the controller 152 may form a second control loop which may be referred to as a common mode control loop. The output 156 of the first ADC 160 may have a value Voutp' which may be a digital value corresponding the value of the voltage Vp on the first load terminal 122. The output 158 of the second ADC 160' may have a value Voutn' which may be a digital value corresponding the value of the voltage Vn on the second load terminal 124.

To measure the value of a load impedance, the controller 152 may generate a first reference signal which may be constant or varying and which may correspond to a desired voltage Vp of the first load terminal 122.

For the differential control loop, the controller 152 may compare the first reference signal value with Voutp' on the first ADC output 156 corresponding to the voltage Vp at the first load terminal 122. The resulting comparison or error value may be input to the first or differential loop DAC 154. The differential loop DAC 154 may then generate a current corresponding to the comparison value. Alternatively the differential loop DAC may generate a voltage which causes the current to vary.

For the common-mode control loop, the controller 102 may compare the second reference signal with Voutn'. The resulting common-mode comparison value may be input to the second DAC 164 which may then generate a current corresponding to the common-mode comparison or error value. The common-mode comparison value may be a difference of the values compared.

For DC load measurement, the differential mode loop may apply a DC voltage across the load, that is to say both the first reference signal and the second reference signal value remains constant. The common mode loop maintains the voltage Vn on the second load terminal 124 at a constant value which may result in no current flowing into the capacitor C2. Consequently, the current flowing through the speaker 118 may be determined by the second or common mode DAC 164. The controller 152 may determine the voltage difference between the first load from the value of Voutp'−Voutn'. For DC load measurement the controller 152 may also determine the current flowing through the load from the value of the differential mode DAC 162. Hence the controller 152 may determine the impedance from the measured voltage difference across the load terminals 122, 124 and the current flowing through the speaker 118.

For AC load measurement, the differential mode loop may apply an AC voltage across the load, i.e. the first reference signal varies. Similarly to the DC load case, the common mode loop maintains the voltage Vn on the second load terminal 124 at a constant value which may result in no current flowing into the capacitor C2. Consequently, the current flow through the speaker is now determined by the second or common mode DAC 164. The controller 152 may determine the voltage difference between the first load terminal 122 and the second load terminal 124 from the value of Voutp'−Voutn'. The controller 152 may determine the current flowing through the load from the value of the common mode DAC 164. Hence the controller 102 may determine the impedance from the measured voltage difference across the load terminals 122, 124, the current flowing through the speaker 118, and using the frequency of the reference AC signal to validate only the frequency band of interest.

Load detector 150 may be separated from the power amplifier and the output filtering. For audio loads typically driven by class-D switching amplifiers, the load detector 150 allows more accurate measurement of the load impedance since for example there is no error due to the ripple current of the class-D switching amplifier. Furthermore there is no need for a current sense circuit in the power path of the amplifier. The power path requires a high current which may be up to 8 Amps in some audio amplifier systems, and consequently a sense circuit may either cause power loss or not be accurate enough to measure the low diagnostic current. The load detector 150 allows the impedance to be determined at low currents and consequently at low power and maybe used to determine if there is a short circuit. Load detector 150 may be used to determine whether or not it is safe to switch on the power amplifier power stages 126, 128.

Figure 3:
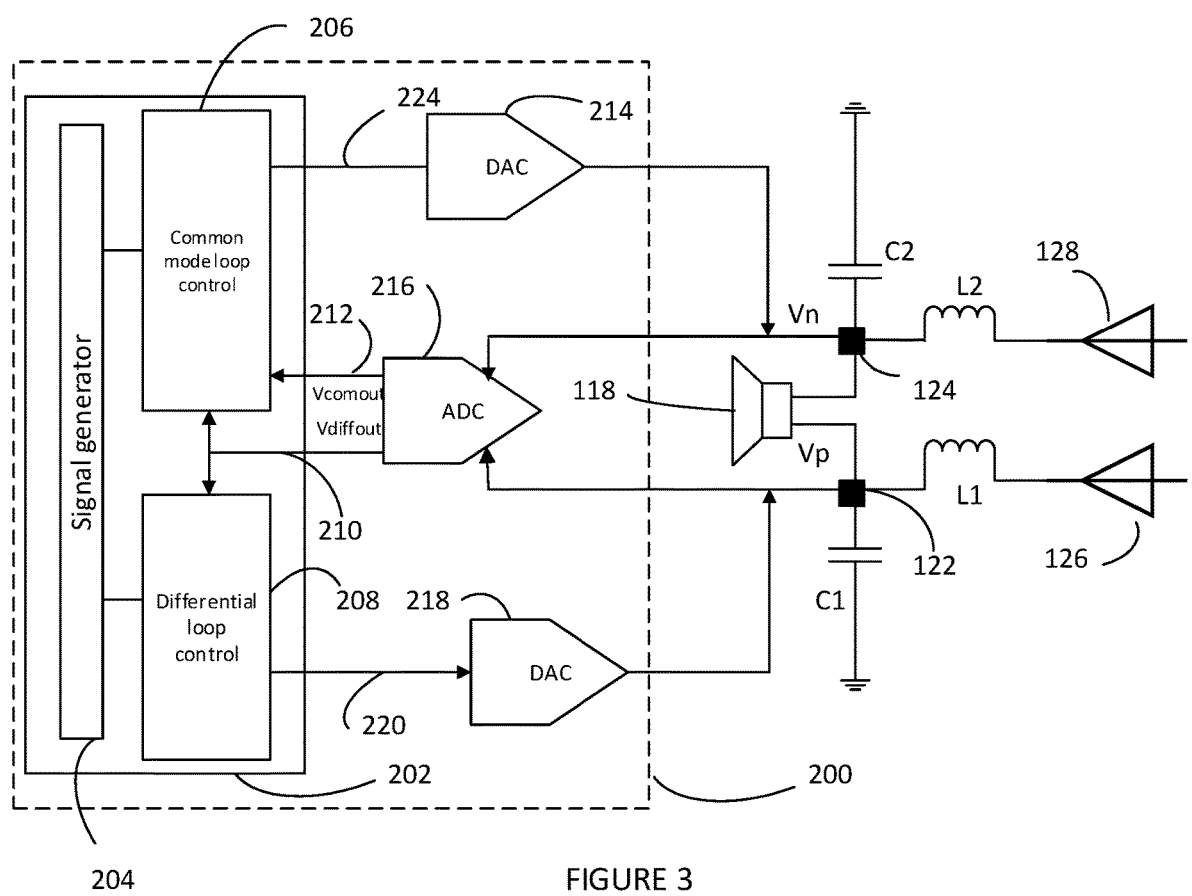
FIG. 3 shows a load detector for an audio amplifier system according to an embodiment.

FIG. 3 shows a load detector 200 for an audio amplifier system. The load detector 200 includes a controller 202 a first DAC 218, a second DAC 214, and an ADC 216 which may be a differential ADC. The controller 202 may include a common mode loop controller 206, a differential loop controller 208 and a signal generator 204. The signal generator 204 may have an output connected to the common mode loop control 206. The signal generator 204 may have an output connected to the differential loop controller 208. The differential loop controller 208 may have an output connected to the common mode loop controller 206.

The common mode controller 206 may have an output 224 connected to the second digital to analog converter 214. The differential mode controller 208 may have an output 220 connected to the first digital to analog converter 218. The differential mode controller 208 may be connected to a first output 210 of the ADC 216. The common mode controller 208 may be connected to a first differential output 210 of the ADC 216. The common mode controller 206 may be connected to a second common-mode output 212 of the ADC 216. An output of the first digital to analog converter 218 may be connected to a first load terminal 122. An output of the second digital to analog converter 214 may be connected to a second load terminal 124. A first input of the ADC 216 may be connected to the first load terminal 122. A second input of the ADC 216 may be connected to the second load terminal 124.

In operation of the audio amplifier system, a load for example a loudspeaker 118 may be connected between the first load terminal 122 and the second load terminal 124. A first capacitor C1 may be connected between the first load terminal 122 and a ground potential. A second capacitor C2 may be connected between the second load terminal 124 and a ground potential. A first inductor L1 may be connected between the first load terminal 122 and the output of a first power driving stage or power amplifier stage 126. A second inductor L2 may be connected between the second load terminal 124 and the output of a second power driving stage or power amplifier stage 128. The first power driving stage 126 and the second power driving stage 128 may be part of a Class-D audio amplifier. The capacitors C1 and C2 and the inductors L1 and L2 may form an output filter for the class-D amplifier.

In operation of the load detector 200, the ADC 216 may have a first input voltage Vp corresponding to the voltage at first load terminal 122, and a second input voltage Vn corresponding to the voltage at second load terminal 124. The common mode voltage Vcom for the ADC 216 is then (Vp+Vn)/2 and the differential voltage Vdiff is Vp−Vn. The value of the common mode output 212 may be denoted Vcomout and the value of differential mode output 210 may be denoted Vdiffout. The ADC 216 may generate a value Vdiffout corresponding to Vdiff and a value Vcomout corresponding to Vcom. During operation of the load detector 200 which may be during a start-up phase of the audio amplifier system, the first power driving stage 126 and the second power driving stage 128 maybe disabled. The first DAC 218, the ADC 216, and the differential mode controller 208 may form a first control loop which may be referred to as a differential control loop. The second DAC 214, the ADC 216, and the common mode controller 206 may form a second control loop which may be referred to as a common mode control loop.

To measure the value of a load impedance, the signal generator 204 may generate a first reference signal which may be constant or varying, and a second reference signal which may be constant.

The differential loop controller 208 may compare the first reference signal value which may correspond to a desired voltage difference between the load terminals 122,124 with Vdiffout. The resulting comparison value may be input to the first or differential-mode DAC 218 which may then generate a current corresponding to the differential comparison value. The differential comparison value may be a difference between the two values being compared.

For the common-mode control loop, the common mode loop controller 206 may compare the second reference signal with a value corresponding to Vn which may be determined by evaluating Vdiffout/2−Vcomout. The resulting common-mode comparison or error value may be used to program the second DAC 214 which may then generate a current corresponding to the common-mode comparison value. The common-mode comparison value may be a difference of the values compared.

For a DC load measurement, the differential mode loop applies a DC voltage across the load, that is to say the first reference signal value remains constant. The common mode loop keeps the voltage Vn on the second load terminal 124 at a constant value determined by the second reference signal, which may result in no current flowing into the capacitor C2. The differential mode loop may maintain the voltage Vp on the first load terminal at a value determined by the first reference signal. Consequently, the current flow through the speaker is now determined by the second or common mode digital to analog converter 214. The controller 202 may determine the voltage difference measured between the first load terminal 122 and the second load terminal 124 from Voutp−Voutn. The controller 202 may determine the current flowing through the load from the value at input 224 of the common mode DAC 214 or the value at the input 220 of the differential mode DAC 218 since the voltages on the first load terminal 122 and the second load terminal 124 are both DC or constant voltages. Hence the controller 202 may determine the impedance from the measured voltage difference across the load terminals 122, 124 and the current flowing through the load 118. The AC load measurement works in a similar way. In this case, the first reference signal is a time varying signal and the second reference signal is a constant value so the controller may determine the current flowing through the load from the value at input 224 of the common mode DAC 214 since only the voltage Vn at the second load terminal 124 is a constant value.

Figure 4:
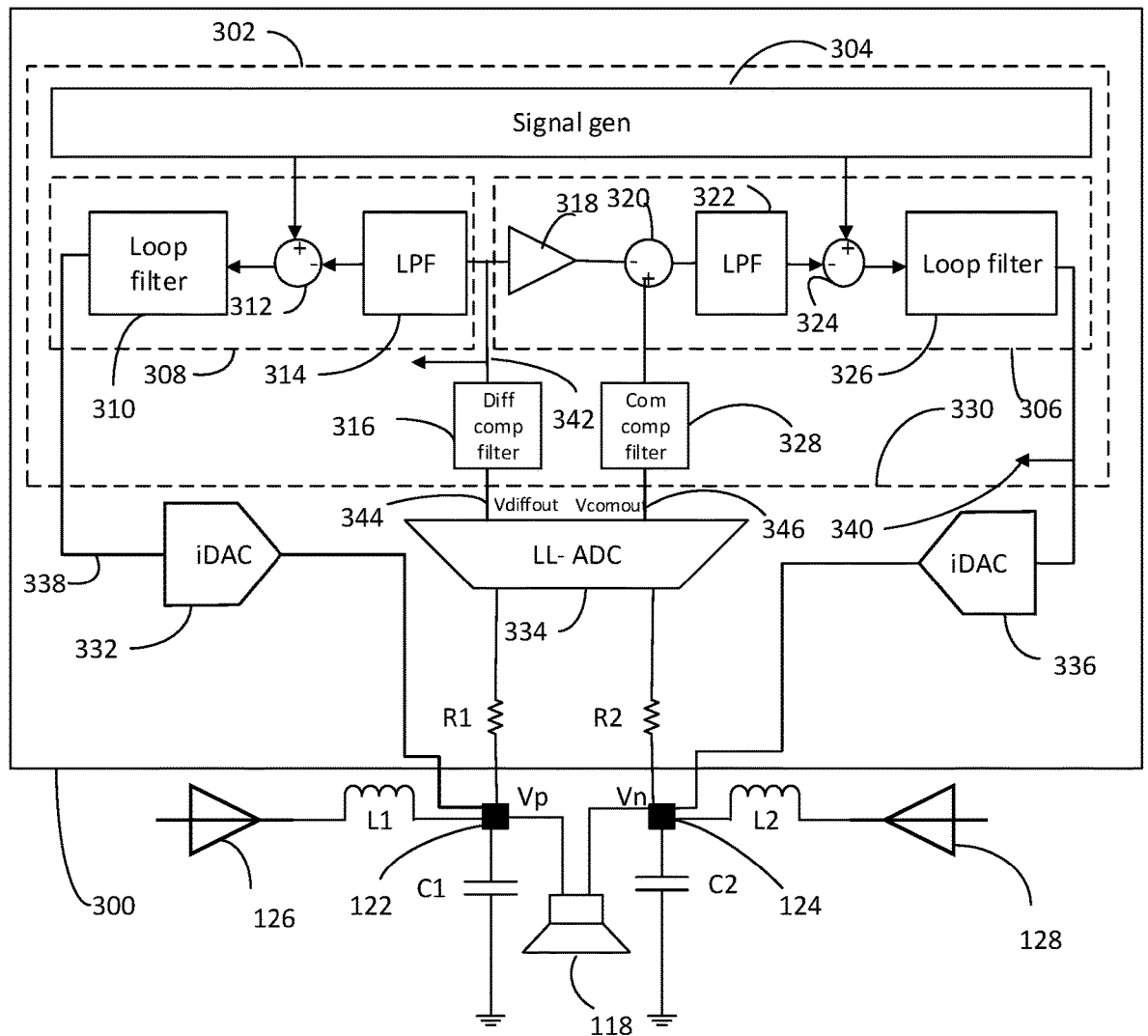
FIG. 4 illustrates a load detector for an audio amplifier system according to an embodiment.

FIG. 4 shows a load detector 300 for an audio amplifier system. The load detector 300 includes a controller 302, a first DAC 332 which may be a current mode DAC or iDAC, a second DAC 336 which may be a current mode DAC or iDAC, and an ADC 334 which may be a low-latency ADC. The first and second DACs may be clocked at a rate of 64*fs where fs is the sample rate of the ADC 334.

The controller 302 may include a common mode loop controller 306, a differential loop controller 308, a differential compensation filter 316, a common mode compensation filter 328 and a signal generator 304. The common mode loop controller 306 and differential loop controller 308 may be clocked at a rate of 512*fs where fs is the sample rate of the ADC 334.

The common mode loop controller 306 may include a series arrangement of a buffer 318, and error amplifier or comparator 320, a low pass filter 322, a second comparator or error amplifier 324, and a loop filter 326. The low pass filter 322 may have a cut-off frequency of 500 KHz, the loop filter 326 may be a second order unity gain low pass filter with a cut-off frequency of 50 KHz.

The differential mode loop controller 308 may include a series arrangement of a lowpass filter 314, a comparator or error amplifier 312, and a loop filter 310. The low pass filter 314 may have a cut-off frequency of 500 KHz, the loop filter 310 may be a second order unity gain low pass filter with a cut-off frequency of 50 KHz.

The signal generator may have a first output connected to an input of the error amplifier 312 in the differential mode loop controller 308. The signal generator 304 may have a second output connected to an input of the second error amplifier 324 in the common mode loop controller 306.

The common mode loop controller 306 may have an output 340 connected to the second digital to analog converter 336. The differential mode controller 308 may have an output 338 connected to the first digital to analog converter 332. The differential compensation filter 316 may be connected to a first output 344 of the ADC 334. The differential compensation filter 316 may have an output connected to the input of the buffer 318 and the differential mode low pass filter 314. The common mode compensation filter 328 may be connected to a second output 344 of the ADC 334. The differential compensation filter 316 and the common mode compensation filter 328 Compensation filter may compensates for the attenuation the ADC 334 which may make the transfer function of the ADC 334 substantially flat over a larger bandwidth for example 10-12 MHz. In other examples for different ADCs, these compensation filters may be omitted.

The common mode compensation filter 328 may have an output connected to the common mode error amplifier 320. An output of the first DAC 332 may be connected to a first load terminal 122. An output of the second DAC 336 may be connected to a second load terminal 124. A first input of the ADC 334 may be coupled to the first load terminal 122 via a resistance R1. A second input of the ADC 334 may be coupled to the second load terminal 124 via a resistance R2.

In normal operation of an audio amplifier system including a load detector 300, a load, for example a loudspeaker 118 may be connected between the first load terminal 122 and the second load terminal 124. A first capacitor C1 may be connected between the first load terminal 122 and a ground potential. A second capacitor C2 may be connected between the second load terminal 124 and a ground potential. A first inductor L1 may be connected between the first load terminal 122 and the output of a first power driving stage or power amplifier stage 126. A second inductor L2 may be connected between the second load terminal 124 and the output of a second power driving stage or power amplifier stage 128. The first power driving stage 126 and the second power driving stage 128 may be part of a Class-D audio amplifier. The capacitors C1 and C2 and the inductors L1 and L2 may form an output filter for the class-D amplifier.

In operation of the load detector 300, the outputs of the first power driving stage 126 and the second power driving stage 128 may be high-ohmic. The first DAC 332, the ADC 334, and the differential mode controller 308 may form a first control loop which may be referred to as a differential control loop. The second DAC 336, the ADC 334, and the common mode controller 306 may form a second control loop which may be referred to as a common mode control loop.

To measure the value of a load impedance, the signal generator 304 may generate a first reference signal which may be constant or varying and a second reference signal which may be constant.

The differential loop controller 308 may compare with the comparator 312 the first reference signal with the output 342 of the differential compensation filter 342 corresponding to the difference between the voltage Vp at the first load terminal 122 and the voltage Vn at the second load terminal 124, which may be referred to as the differential voltage output. The resulting comparison value may be input via the loop filter 310 to the first or differential-mode DAC 332 which may then generate a current corresponding to the differential comparison value. The differential comparison value may be a difference between the two values being compared.

For the common-mode control loop, the common mode loop controller 306 may compare with second comparator 324 a second reference signal with the value of voltage Vn on the second load terminal 124. The voltage Vn on the second load terminal may be determined by comparator 320 from the difference between the output of the common mode compensation filter 328 corresponding to the common mode value, i.e. (Vp+Vn)/2 and half the value of the first ADC output corresponding to the voltage difference between the load terminals Vp−Vn. The second reference signal may be a constant value. The resulting common-mode comparison value may be input to the second DAC 336 which may then generate a current corresponding to the common-mode comparison value. The common-mode comparison value may be a difference of the values compared.

For DC load measurement, the differential mode loop applies a DC voltage across the load, that is to say the reference signal value remains constant. The common mode loop keeps the voltage Vn on the second load terminal 124 at a constant value which may result in no current flowing into the capacitor C2. Consequently, the current flow through the speaker 118 is now determined by the second or common mode DAC 336. The controller 302 may determine the voltage difference measured between the first load terminal 122 and the second load terminal 124 at the differential compensation filter output 342. For DC measurement, the controller 302 may also determine the current flowing through the load from the value of the differential mode DAC 3324. Hence the controller 302 may determine the impedance from the measured voltage difference across the load terminals 122, 124 and the current flowing through the load 118. The AC load measurement works in a similar way. In this case, the first reference signal is a time varying signal and the second reference signal is a constant value.

Since the frequency of the first reference signal is predetermined, the frequency may be used in addition to the measured load voltage and current to determine an impedance value.

Example audio amplifying systems including load detector 300 may be included in a vehicle audio system. In operation if a speaker is connected, the action of a door slamming in a car or other motor vehicle may induce a potential difference on the load terminals 122, 124. This may be detected by the controller 302 and processed by further circuitry (not shown) which may include a digital signal processor. The further circuitry may determine whether a door slam has occurred and if so disregard a load measurement. Audio amplifier systems included in a car or other motor vehicle may have many other sources of interference making it difficult to accurately measure the impedance, current and voltage for an audio load. By detecting an induced voltage which is outside a predetermined limit, the load detector may discard an invalid load measurement and thereby improve the load measurement accuracy.

Figure 5:
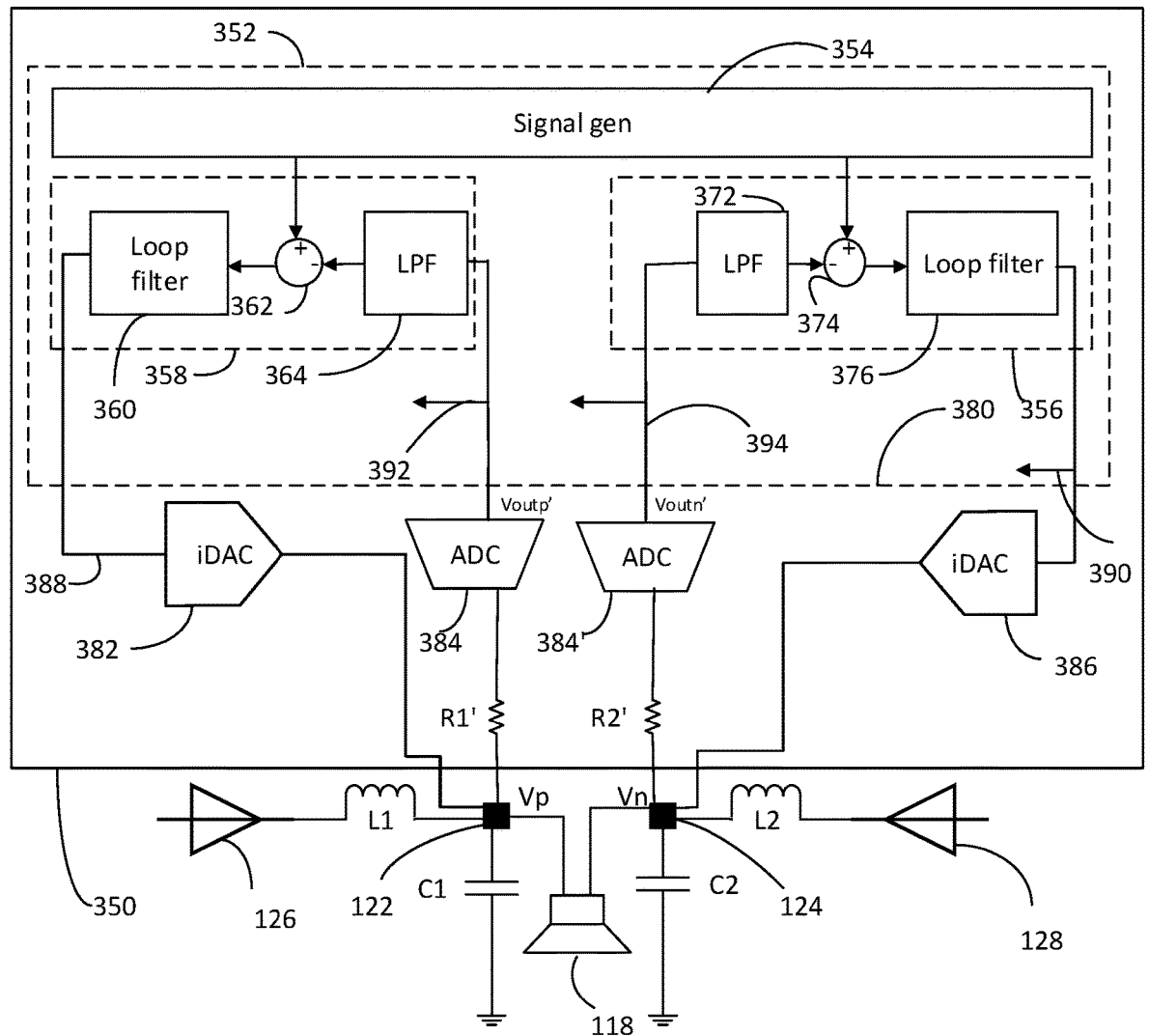
FIG. 5 shows a load detector for an audio amplifier system according to an embodiment.

FIG. 5 shows a load detector 350 for an audio amplifier system. The load detector 350 includes a controller 352, a first DAC 382 which may be a current mode DAC or iDAC, a second DAC 386 which may be a current mode DAC or iDAC, a first ADC 384 and a second ADC 384'.

The controller 352 may include a common mode loop controller 356, a differential loop controller 358, and a signal generator 354.

The common mode loop controller 356 may include a series arrangement of a low pass filter 372, a comparator or error amplifier 374, and a loop filter 376. In other examples, the lowpass filter 372 may be omitted.

The differential mode loop controller 358 may include a series arrangement of a lowpass filter 364, a comparator or error amplifier 362, and a loop filter 360. In other examples, the lowpass filter 364 may be omitted.

The signal generator 354 may have a first output connected to an input of the error amplifier 362 in the differential mode loop controller 358. The signal generator 354 may have a second output connected to an input of the error amplifier 374 in the common mode loop controller 306.

The differential loop controller 358 may have an output 390 connected to the second digital to analog converter 386. The differential mode controller 358 may have an output 388 connected to the first digital to analog converter 382. An output 392 of the first ADC 384 may be connected to the low pass filter 364 in the differential loop controller 358.

The common mode loop controller 356 may have an output 392 connected to the second digital to analog converter 386. The differential mode controller 358 may have an output 388 connected to the first digital to analog converter 382. An output 392 of the first ADC 384 may be connected to the low pass filter 364 in the common mode loop controller 356.

An output of the first DAC 382 may be connected to a first load terminal 122. An output of the second DAC 386 may be connected to a second load terminal 124. A first input of the ADC 384 may be coupled to the first load terminal 122 via a resistance R1'. A second input of the ADC 110 may be coupled to the second load terminal 124 via a resistance R2'.

In normal operation of an audio amplifier system including a load detector 350, a load, for example a loudspeaker 118 may be connected between the first load terminal 122 and the second load terminal 124. A first capacitor C1 may be connected between the first load terminal 122 and a ground potential. A second capacitor C2 may be connected between the second load terminal 124 and a ground potential. A first inductor L1 may be connected between the first load terminal 122 and the output of a first power driving stage or power amplifier stage 126. A second inductor L2 may be connected between the second load terminal 124 and the output of a second power driving stage or power amplifier stage 128. The first power driving stage 126 and the second power driving stage 128 may be part of a Class-D audio amplifier. The capacitors C1 and C2 and the inductors L1 and L2 may form an output filter for the class-D amplifier.

In operation of the load detector 350, the outputs of the first power driving stage 126 and the second power driving stage 128 may be high-ohmic. The first DAC 332, the ADC 334, and the differential mode controller 358 may form a first control loop which may be referred to as a differential control loop. The second DAC 386, the ADC 384, and the common mode controller 356 may form a second control loop which may be referred to as a common mode control loop.

To measure the value of a load impedance, the signal generator 354 may generate a first reference signal which may be constant or varying and corresponds to a desired value of voltage Vp on the first load terminal 122. The signal generator 354 may generate a second reference signal which may be a constant value and corresponds to a desired value of voltage Vn on the second load terminal 124.

The differential loop controller 358 may compare with the comparator 362 the first reference signal with the value of the first ADC output 392 denoted as Voutp' corresponding to the difference between the voltage Vp at the first load terminal 122. The resulting comparison value may be input via the loop filter 360 to the first or differential-mode DAC 332 which may then generate a current corresponding to the differential comparison value. The differential comparison value may be a difference between the two values being compared.

For the common-mode control loop, the common mode loop controller 356 may compare with comparator 374 a second reference signal with the value of the second ADC output 394 denoted as Voutn' which corresponding to the voltage Vn on the second load terminal 124. The resulting common-mode comparison value may be input to the second DAC 386 which may then generate a current corresponding to the common-mode comparison value. The common-mode comparison value may be a difference of the values compared.

For DC load measurement, the differential mode loop may apply a DC voltage across the load, that is to say the reference signal value remains constant. The common mode loop keeps the voltage Vn on the second load terminal 124 at a constant value which may result in no current flowing into the capacitor C2. Consequently, the current flow through the speaker 118 is now determined by the second or common mode DAC 386. The controller 352 may determine the voltage difference from Voutp'–Voutn' at the first and second ADC outputs 392,394 with further circuitry (not shown). For example a microprocessor may be coupled to a programmable register in the first and second ADCs 384, 384'. The controller 352 may determine the current flowing through the load from the value of the common mode DAC 114 with further circuitry (not shown). For example a microprocessor may be coupled to a programmable register in the iDAC 386.

Hence the controller 352 may determine the impedance from the measured voltage difference across the load terminals 122, 124 and the current flowing through the load 118. The AC load measurement works in a similar way. In this case, the first reference signal is a time varying signal and the second reference signal is a constant value. Since the frequency of the first reference signal is predetermined, the frequency may be used in addition to the measured load voltage and current to determine an impedance value.

Figure 6:
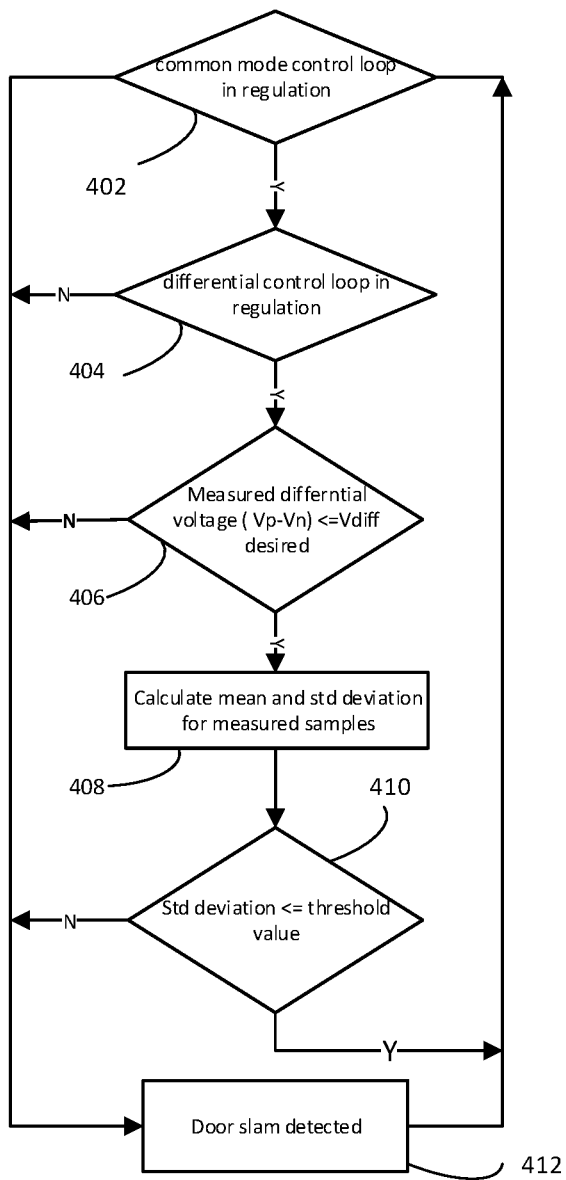
FIG. 6 illustrates a door slam detection method according to an embodiment.

FIG. 6 shows an example door slam detection 400 which may be implemented on one or more embodiments of the load detector for example load detector 350. In step 402 the common mode control loop may be checked to determine whether or not it is in regulation. This may be done for example comparing the difference corresponding to the error between the detected second load terminal voltage and the second reference signal with a predetermined threshold value. If the difference is greater than the threshold value then the common mode loop may be considered as out of regulation. If the common mode control loop is not in regulation then a door slam is assumed to be detected in step 412. Following on from step 412, the door slam detection may return to the first step 402 and repeat.

If the common mode control loop is in regulation then in step 404 the differential control loop may be checked to determine whether or not it is in regulation. This may be done for example comparing the difference corresponding to the error between the detected first load terminal voltage and the first reference signal with a predetermined threshold value which may be the same or different to the threshold value in the common mode loop. If the difference is greater than the threshold value then the differential mode loop may be considered as being out of regulation. If the differential control loop is not in regulation then a door slam is assumed to be detected in step 412.

If the differential control loop is in regulation then in step 406, the measured voltage difference across the load terminals may be compared with the desired voltage difference. If the measured voltage difference is greater than the desired difference then a door slam is assumed to be detected in step 412. If the measured voltage difference is less than or equal than the desired difference then in step 408 an average and standard deviation for a number of samples may be determined. In step 410 a comparison may be made between a predetermined threshold value and the calculated standard deviation. If the standard deviation is greater than a threshold value then a door slam is assumed to be detected in step 412. If the standard deviation is less than or equal to a threshold value then a door slam is not detected and the process may move to step 402.

The door slam detection 400 may be implemented in hardware, software running on a microprocessor or digital signal processor or a combination of hardware and software which may be included in one or more embodiments of the load detector.

Figure 7:
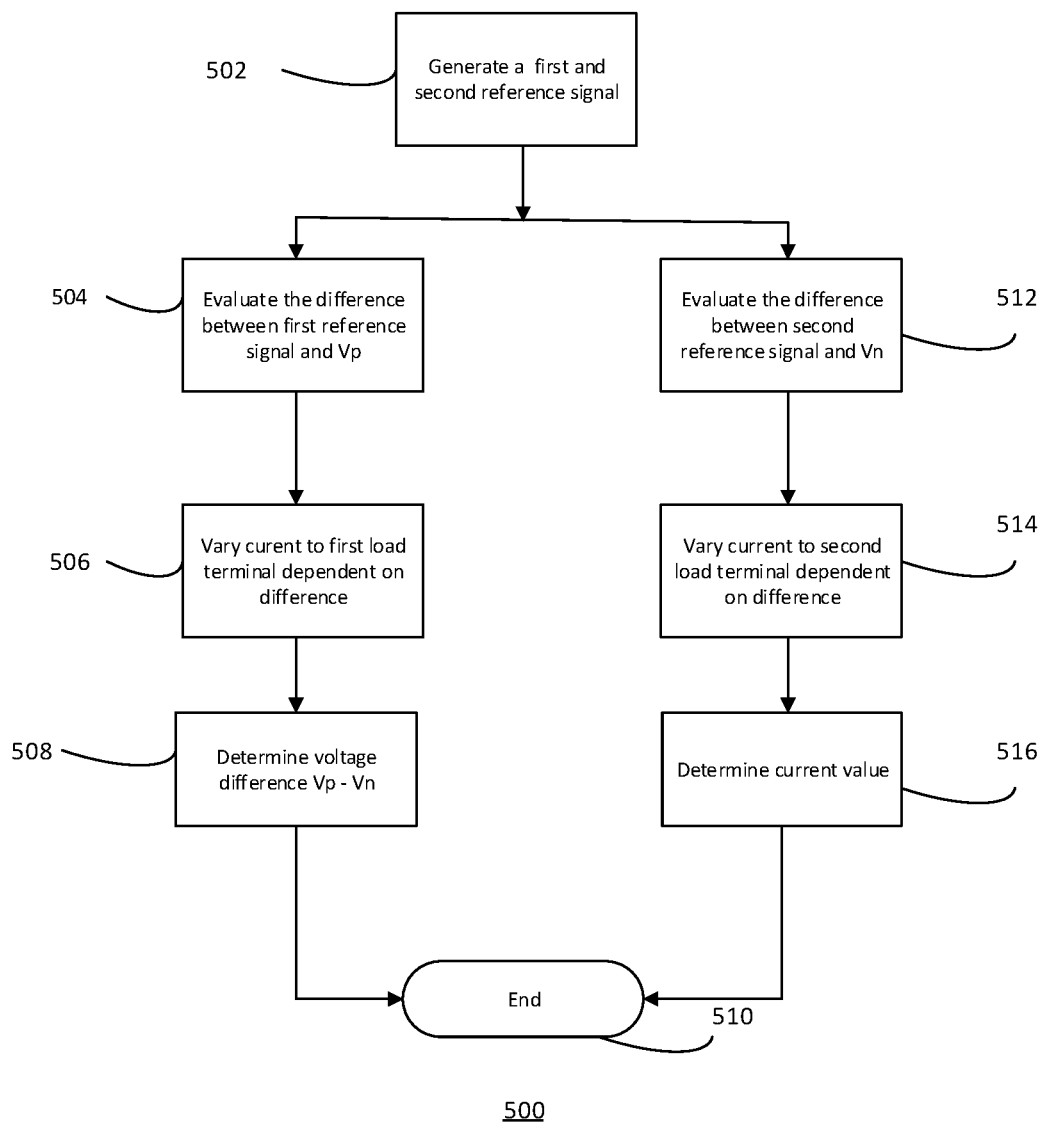
FIG. 7 shows a method of detecting a characteristic of a load of an audio amplifier system according to an embodiment.

FIG. 7 shows a method of detecting a load connected between two load terminals for an audio amplifier system 500. The amplifier power stages may be disabled so that they are not simultaneously driving the load, i.e. in a high impedance operation mode. The method may therefore be used during a start-up or initial phase of the audio amplifier system. In step 502 a first and second reference signal may be generated. The first reference signal may represent a desired voltage difference Vp–Vn to be applied across a connected load in an audio amplifier system, typically one or more loudspeakers. The first reference signal may be constant or varying. The second reference signal may represent an offset value to be applied to one of the terminals Vn.

A first control loop may include method steps 504, 506, 508. In step 504 a difference between the first reference signal and the voltage difference between the load terminals Vp–Vn may be evaluated. In step 506, a current value supplied to a first load terminal may be changed according to the detected difference. The voltage difference value between the load terminals may be determined in step 508.

A second control loop may include method steps 512, 514, 516. In step 512 a difference between the second reference signal and the voltage at a second load terminals Vn may be evaluated. In step 514, a current value supplied to the second load terminal may be changed or varied according to the difference detected. The final current value supplied to the second load terminal may be determined in step 516.

When both first and second control loops are stable the method may finish at step 510.

For DC load measurement, the first loop may apply a DC voltage across the load, that is to say the first reference signal value remains constant. The second control loop maintains the voltage Vn on the second load terminal at a constant value determined by the second reference signal. Consequently, the current flow through a load is determined by the first or second control loop. The voltage difference measured between a first load terminal and a second load terminal may be determined from the first control loop. In this way, the method 400 may be used to determine the characteristics of a load connected to the load terminals. This may for example be used to determine whether or not there is a fault in a connected load. The AC load measurement works in a similar way. In this case, the first reference signal is a time varying signal and the second reference signal is a constant value.

Examples of the load detector and audio amplifying system herein described may allow the accurate measurement a wide range of loud speaker impedances (from 0.5 ohm up to 10 Ohm) every amplifier start. For example for 0.5 Ohm speakers (dual voice coil speakers), it is usually difficult to distinguish between a short circuit and a correct speaker load. Characteristics of the load connected may be detected, before the power amplifier is switched on. For example with a shorted load, high currents will flow when the power amplifier is switched on or enabled, and an audio signal is applied to the amplifier, which may damage the audio components.

In examples, the load detector may identify if an AC-coupled speaker (tweeter) is connected correctly without the need of audio signals from an external digital signal processor (DSP). The tweeter may be connected in parallel with a (mid tone) speaker. Examples of the load detector may enable both speakers to be detected correctly.

For example car audio amplifier including a load detector, the load detector may also operate during a door-slam. When a car door is closed, the air will move the loudspeaker. The speaker will act as a generator and the load measurements may be disturbed. This may be detected, for example as an unexpected voltage level and discarded.

When load detection is performed conventionally with a switching Class-D amplifier, the ripple current in the reconstruction output filter will generate an error on the load measurements. Especially with cheaper inductors with a low inductor value, the ripple current and error will increase.

When using a power amplifier; it may be difficult to get an accurate current measurement through the load without having a series/parallel impedances, like LC-filter, in series with the load which will cause power loss/dissipation. The power stage is made for high currents which will make a current sense for low current difficult. Furthermore, the power stage is a PWM switching output generating a ripple current in the filter stage. This ripple current is higher with lower inductor values of the filter and will make an error on the current measurements.

Examples of the load detector may bring the load terminals and consequently the outputs of the amplifier power stages to a DC voltage without pop-noise. The digital control loop of the amplifier (not shown) may then switch-on the power stage without any audible artefacts. The digital control loops need a positive and negative headroom, to get into regulation.

Examples of the load detector described herein allows for load diagnosis before the amplifier is started up, so called start-up diagnostic. The load diagnostic may be inaudible and may be performed within a fraction of a second. The load detector may allow many load levels to be discriminated, for example shorted-, normal-, line-driver- and open loads. A shorted load may have an impedance of less than 0.5 ohms. A normal load may have an impedance between 1.5 to 20 ohms. A line driver may have an impedance between 80 ohms to 3 KOhms. An open load may have an impedance greater than 8 KOhms.

A method and apparatus of load detection for an audio amplifier system is described. A load detector includes a first load terminal and a second load terminal; a controller coupled to the first and second load terminals and configured to in a first control loop, vary a first current supplied to a first load terminal dependent on the difference between a first reference signal and the detected first load terminal voltage; and in a second control loop, vary a second current supplied to the second load terminal dependent on the difference between a second reference signal and the detected second load terminal voltage; and to determine a current through a load connected between the first load terminal and the second load terminal from the second current value, and a voltage across the load from the detected voltage difference between the first load terminal voltage and the second load terminal voltage.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfill the functions of several means recited in the claims and reference signs in the claims shall not be construed as limiting the scope of the claims.

The invention claimed is:

1. A load detector for an audio amplifier system, the load detector comprising:
   a first load terminal and a second load terminal;
   a controller coupled to the first and second load terminals and configured to:
      in a first control loop, vary a first current supplied to the first load terminal dependent on a first reference signal and a detected first load terminal voltage;
      in a second control loop, vary a second current supplied to the second load terminal dependent on a second reference signal and a detected second load terminal voltage;
      wherein at least one of the first reference signal and the second reference signal is a constant value and the controller is configured to
      determine a load current through a load connected between the first load terminal and the second load terminal from one of the first and second current value, and a load voltage across the load from the difference between the detected first load terminal voltage and the second load terminal voltage.

2. The load detector of claim 1, further comprising a first and second programmable voltage or current source, each programmable voltage or current source having an input coupled to the controller and an output coupled to a respective one of the first load terminal and the second load terminal, and wherein the controller is further configured to vary the first current by programming the first programmable voltage or current source with a value dependent on the difference between a first reference signal and at least one of the detected first load terminal voltage and the detected voltage difference between the first and second load terminals; and to vary the second current by programming the second programmable current source with a value dependent on the detected second load terminal voltage.

3. The load detector of claim 2, wherein each of the first and second programmable voltage or current sources comprises a digital to analog converter.

4. The load detector of claim 1, further comprising a voltage detector having a first and second input coupled to a respective one of the first and second load terminals and a first and second output coupled to the controller, wherein the voltage detector is configured to output one of a detected voltage difference value and a first load terminal voltage value on the first output, and further configured to output one of a common mode value and a second load terminal voltage value on the second output.

5. The load detector of claim 4, wherein the voltage detector comprises at least one analog to digital converter.

6. The load detector of claim 4, wherein the voltage detector comprises a first analog to digital converter coupled between the first load terminal and the controller and second analog to digital converter coupled between the second load terminal and the controller.

7. The load detector of claim 4, wherein the controller comprises a differential loop controller arranged in the first control loop, a common mode loop controller arranged in the second control loop, and a signal generator coupled to the differential loop controller and the common mode loop controller, the differential loop controller having an input coupled to the first voltage detector output and an output coupled to the first programmable voltage or current source,
the common mode loop controller having an input coupled to the second voltage detector output and an output coupled to the second programmable voltage or current source.

8. The load detector of claim 7, wherein each of the differential loop controller and the common mode controller comprises a series arrangement of a low pass filter, a comparator, and a loop filter, each comparator having a first input coupled to a respective signal generator output, and a second input coupled to a respective low pass filter output.

9. The load detector of claim 8, wherein the common mode loop controller further comprises an attenuator coupled to the second voltage detector output, a further comparator coupled to the attenuator output and configured to determine the difference between the common mode value and the attenuated output, and wherein the further comparator output is coupled to the low pass filter input.

10. The load detector of claim 1, wherein the first reference signal corresponds to a required voltage difference between the first and second load terminals and the second reference signal is a constant value corresponding to a required offset voltage value at the second load terminal.

11. The load detector of claim 1, wherein the second reference signal is a constant value and the controller is configured to determine the load current from the second current value.

12. The load detector of claim 1, wherein the controller is further configured to determine an average value of load current and load voltage and a standard deviation of the load current and load voltage values.

13. The load detector of claim 1, wherein the controller is further configured to generate a signal indicative of a vehicle door-slam in response to at least one of
the first control loop being out of regulation,
the second control loop being out of regulation,
the load voltage value being above a predetermined threshold, and
the standard deviation of the load voltage value being above a predetermined threshold.

14. An amplifier system comprising the load detector of claim 1, and further comprising an audio amplifier having at least one power amplifier stage with an output coupled to at least one of the first load terminal and the second load terminal wherein the controller is coupled to the at least one power stage, and wherein the controller is further configured to determine a load impedance of a load connected between the first load terminal and the second load terminal from the detected voltage difference and the second current value and to enable the at least one power stage in response to the load impedance value being within an expected load impedance range.

15. A method for detecting an audio amplifier system load connected between a first load terminal and a second load terminal, the method comprising:
generating a first and second reference signal;
in a first control loop, varying a first current supplied to the first load terminal dependent on a first voltage difference between the first reference signal and a detected voltage at the first load terminal;
in a second control loop, varying a second current supplied to the second load terminal dependent on a second voltage difference between the second reference signal and a detected voltage at the second load terminal; and
determining a current through the audio amplifier system load connected between the first load terminal and the second load terminal from a value of the second current, and a voltage across the audio amplifier system load from the first and the second voltage difference.

\* \* \* \* \*